(12) United States Patent
Eberhard

(10) Patent No.: US 10,468,555 B2
(45) Date of Patent: Nov. 5, 2019

(54) METHOD FOR PRODUCING A SEMICONDUCTOR BODY

(71) Applicant: OSRAM Opto Semiconductors GmbH, Regensburg (DE)

(72) Inventor: Franz Eberhard, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 53 days.

(21) Appl. No.: 15/552,181

(22) PCT Filed: Feb. 10, 2016

(86) PCT No.: PCT/EP2016/052809
§ 371 (c)(1),
(2) Date: Aug. 18, 2017

(87) PCT Pub. No.: WO2016/131689
PCT Pub. Date: Aug. 25, 2016

(65) Prior Publication Data
US 2018/0076359 A1    Mar. 15, 2018

(30) Foreign Application Priority Data
Feb. 19, 2015   (DE) .......................... 10 2015 102 378

(51) Int. Cl.
*H01L 21/00* (2006.01)
*H01L 33/38* (2010.01)
(Continued)

(52) U.S. Cl.
CPC ........ *H01L 33/382* (2013.01); *H01L 33/0095* (2013.01); *H01L 33/24* (2013.01);
(Continued)

(58) Field of Classification Search
CPC ... H01L 21/743; H01L 33/0095; H01L 33/24; H01L 33/44; H01L 33/382
(Continued)

(56) References Cited

U.S. PATENT DOCUMENTS 4,731,340 A   3/1988   Chang et al.
5,534,452 A   7/1996   Nakanishi et al.
(Continued)

FOREIGN PATENT DOCUMENTS

CN   202094125 U   12/2011
DE   102010044738 A1   3/2012
(Continued)

*Primary Examiner* — Brook Kebede
(74) *Attorney, Agent, or Firm* — Slater Matsil, LLP

(57) ABSTRACT

A method for producing a semiconductor body is disclosed. In an embodiment, the method includes providing a semiconductor body, applying a first mask layer and a second mask layer to the semiconductor body and forming at least one second mask opening in the second mask layer and at least one recess in the semiconductor body in a region of the at least one first mask opening in the first mask layer, wherein the recess comprises a side face and a bottom face and the recess forms an undercut with the second mask opening. The method further includes applying a passivation layer unpatterned to the second mask layer and to the side face and the bottom face of the at least one recess and removing the passivation layer so that the passivation layer remains at least in part on the side face of the at least one recess.

20 Claims, 6 Drawing Sheets

(51) Int. Cl.
  *H01L 33/00* (2010.01)
  *H01L 33/24* (2010.01)
  *H01L 33/44* (2010.01)
  *H01S 5/028* (2006.01)
  *H01S 5/042* (2006.01)

(52) U.S. Cl.
  CPC ............ *H01L 33/44* (2013.01); *H01S 5/0282* (2013.01); *H01S 5/0425* (2013.01); *H01L 2933/0016* (2013.01); *H01L 2933/0025* (2013.01)

(58) Field of Classification Search
  USPC .......................................................... 438/38
  See application file for complete search history.

(56) References Cited

U.S. PATENT DOCUMENTS

| | | | | |
|---|---|---|---|---|
| 5,731,604 | A | * | 3/1998 | Kinzer ................ H01L 29/1095 257/153 |
| 6,448,657 | B1 | | 9/2002 | Dorleans |
| 8,896,019 | B2 | | 11/2014 | Eberhard et al. |
| 2006/0105520 | A1 | * | 5/2006 | Tan ........................... G03F 1/30 438/244 |
| 2008/0050919 | A1 | | 2/2008 | Van Aelst et al. |
| 2008/0067539 | A1 | | 3/2008 | Shakuda |
| 2010/0009543 | A1 | * | 1/2010 | Cho .................... H01L 21/0206 438/735 |
| 2011/0207323 | A1 | | 8/2011 | Ditizio |
| 2013/0140598 | A1 | | 6/2013 | Höppel et al. |
| 2013/0210178 | A1 | | 8/2013 | Li et al. |
| 2014/0027802 | A1 | | 1/2014 | Yu et al. |
| 2015/0255692 | A1 | | 9/2015 | Pfeuffer |

FOREIGN PATENT DOCUMENTS

| | | |
|---|---|---|
| DE | 102011010362 A1 | 8/2012 |
| DE | 102012107921 A1 | 3/2014 |
| JP | H01109772 A | 4/1989 |
| JP | H03227026 A | 10/1991 |
| JP | H0521473 A | 1/1993 |
| JP | H0536846 A | 2/1993 |
| JP | H05259188 A | 10/1993 |
| JP | H05335341 A | 12/1993 |
| JP | 2008028128 A | 2/2008 |
| JP | 2008060132 A | 3/2008 |
| JP | 2013520830 A | 6/2013 |
| JP | 2013157476 A | 8/2013 |

* cited by examiner

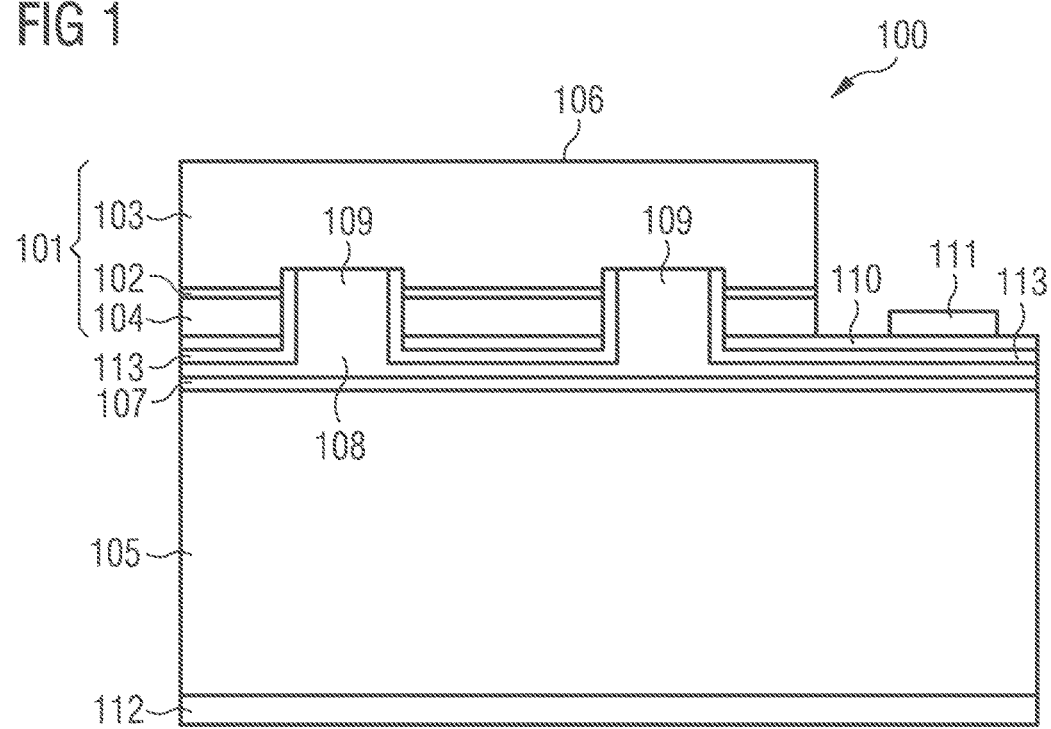

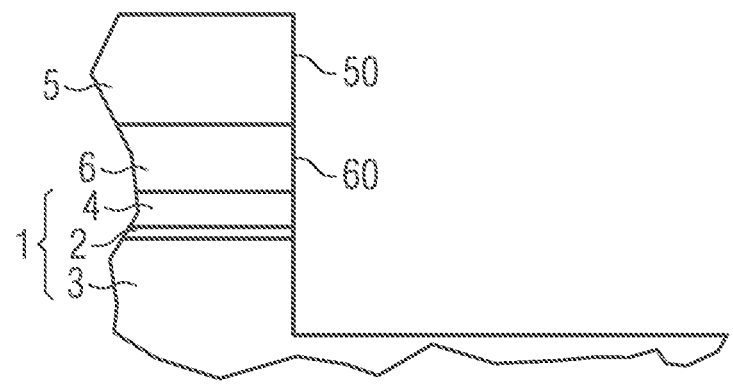
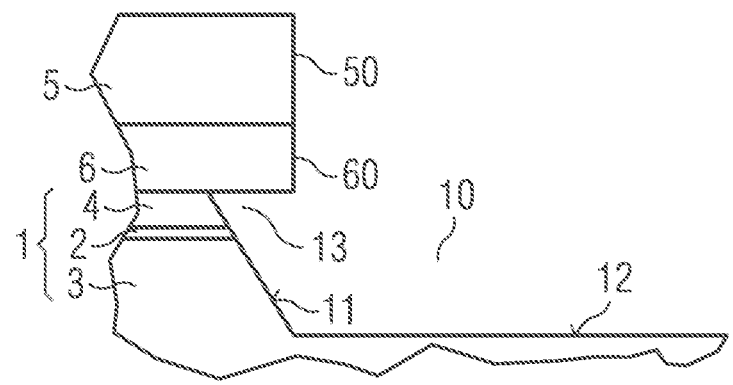

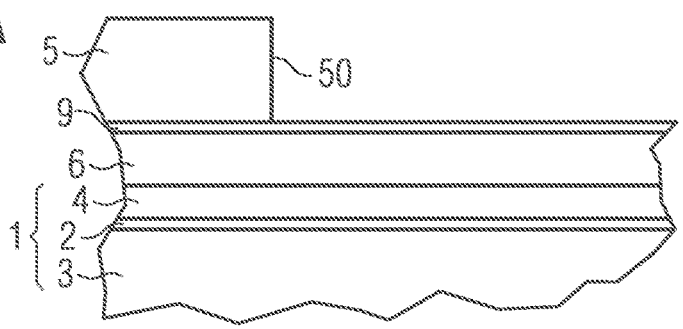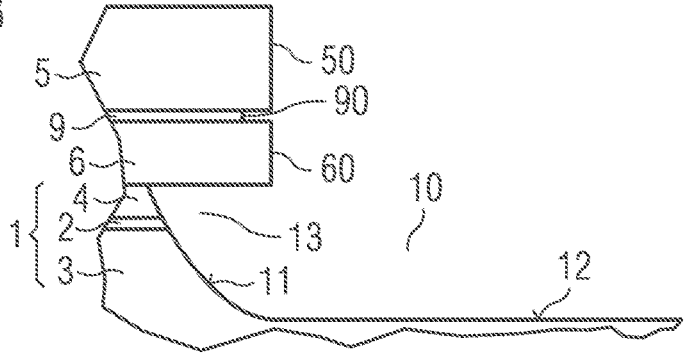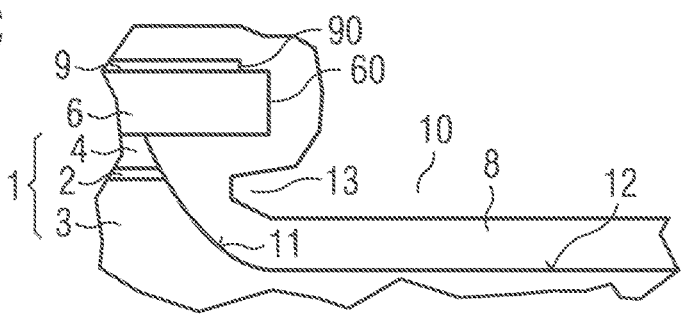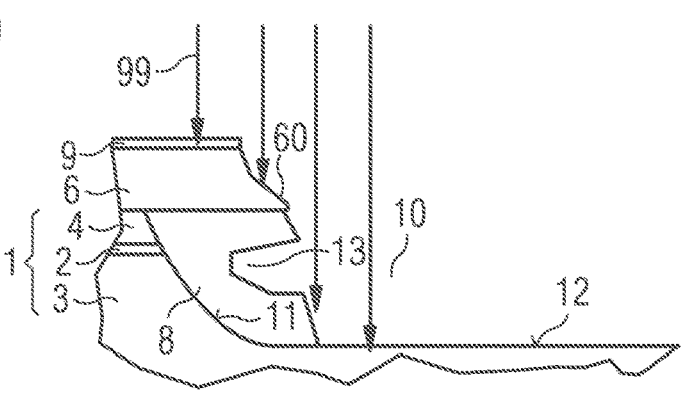

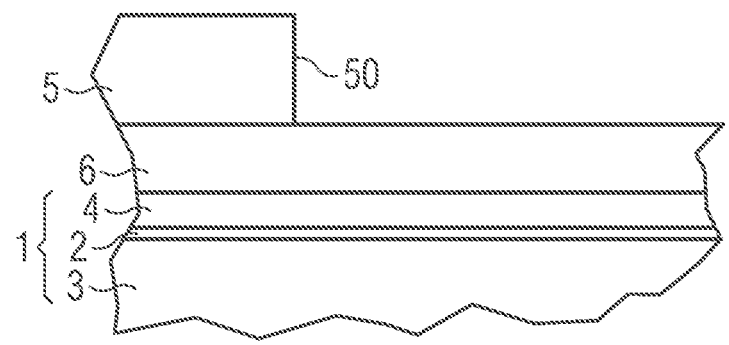
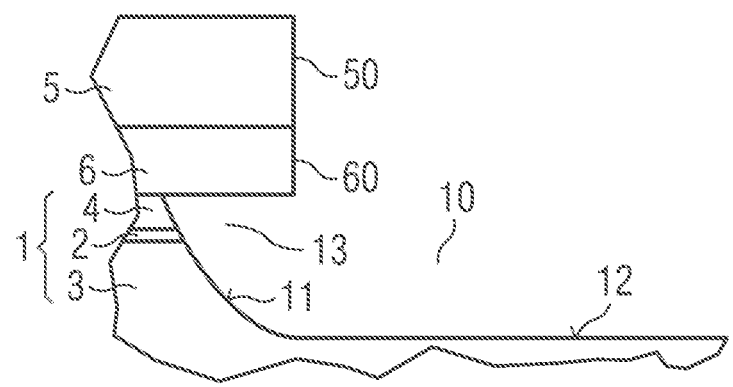

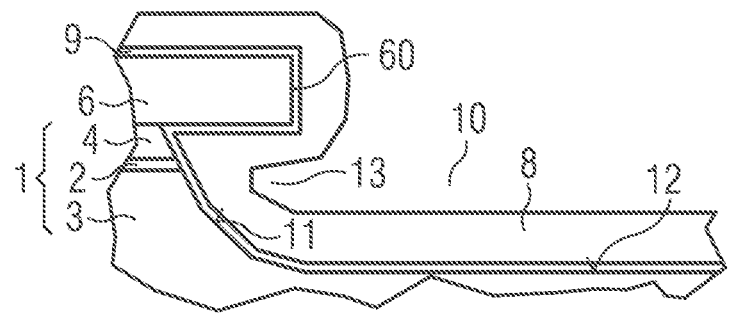
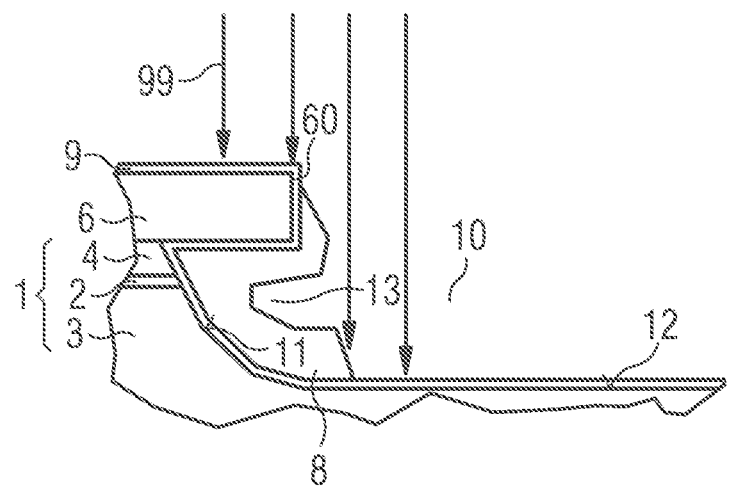
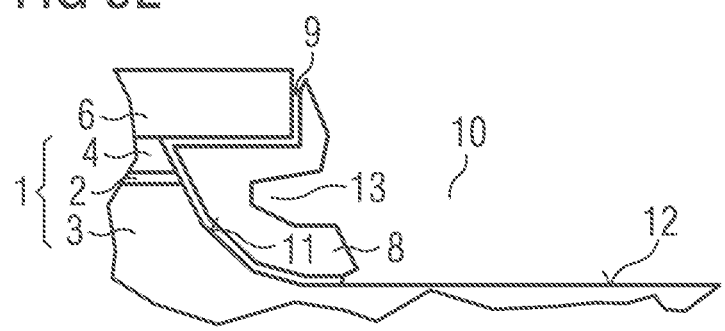

METHOD FOR PRODUCING A SEMICONDUCTOR BODY

This patent application is a national phase filing under section 371 of PCT/EP2016/052809, filed Feb. 10, 2016, which claims the priority of German patent application 10 2015 102 378.4, filed Feb. 19, 2015, each of which is incorporated herein by reference in its entirety.

TECHNICAL FIELD

A method is provided for producing a semiconductor body with a recess.

BACKGROUND

In order to contact a semiconductor layer, covered with one or more further semiconductor layers, of a semiconductor layer sequence, one or more through-connections, so-called vias, may be used, which extend through the covering semiconductor layers to the semiconductor layer to be contacted. These through-connections are conventionally openings in the semiconductor layer sequence in the form of blind holes which project through a part of the semiconductor layer sequence and which are filled with an electrically conductive material. To prevent a through-connection short-circuiting the semiconductor layers through which it passes, the sidewalls of the openings in which through-connections are arranged are conventionally provided with an electrically insulating layer, such that, within the semiconductor layer sequence, the through-connection is in electrical contact only with the semiconductor layer to be contacted.

To produce a through-connection, therefore, firstly an opening has to be produced in the semiconductor layer sequence. Secondly, the sidewalls of the opening need to be provided with an electrically insulating layer, wherein that part of the opening in which the semiconductor layer to be contacted lies exposed must be at least partly free of the electrically insulating layer. These two steps are conventionally performed in the prior art using photoresist masks and with the assistance of two separate photo levels. This means that one photomask is used to produce the openings in the semiconductor layer sequence and then a further photomask is used to pattern the electrically insulating layer in such a way that the openings in the region of the semiconductor layer to be contacted are at least partially free of the electrically insulating layer. For this purpose, extremely accurate and thus complex process control is needed, since the second photomask requires very high precision.

SUMMARY OF THE INVENTION

Embodiments of the invention provide a method for producing a semiconductor body which comprises at least one recess provided with a passivation layer.

Advantageous embodiments and further developments of the subject matter are revealed by the following description and drawings.

According to at least one embodiment, a method is provided for producing a semiconductor body. The method may in particular be a method for producing a semiconductor body with at least one recess provided with a passivation layer.

According to one further embodiment, a semiconductor body is provided. The semiconductor body may comprise one or more semiconductor layers, which preferably form a semiconductor layer sequence and which may be applied to a growth substrate by an epitaxial growth method. The semiconductor body may, for example, be a semiconductor layer sequence which is provided for the production of optoelectronically active semiconductor chips, for example, light-emitting or light-absorbing semiconductor chips. To this end, the semiconductor body may comprise a semiconductor layer sequence with at least one optoelectronically active region, in particular a light-emitting or light-detecting region, which is arranged between further semiconductor layers which may have mutually different conduction types. Alternatively, the semiconductor body may also be a non-optoelectronically active semiconductor body. For example, the semiconductor body may be provided for the production of electronic semiconductor chips such as, for example, transistors or other electronic devices. The semiconductor body may be provided on a carrier element which may be a growth substrate or a carrier substrate other than a growth substrate.

The semiconductor body may be based, for example, on a compound semiconductor material system, in particular a III-V compound semiconductor system, and comprise semiconductor layers which comprise an arsenide, phosphide and/or nitride compound semiconductor material. Alternatively, other semiconductor materials are also feasible, for example, II-VI compound semiconductor materials, silicon-based semiconductor materials or germanium-based semiconductor materials.

According to one further embodiment, a first mask layer is applied to the semiconductor body. The semiconductor body may in particular, in terms of the production thereof in the form of one or more semiconductor layers, have a growth direction such that the semiconductor body terminates with a major surface in the growth direction. The first mask layer may in particular be arranged on the major surface terminating the semiconductor body in the growth direction, which surface may be perpendicular to the growth direction.

In particular, the first mask layer may be a resist mask, i.e., in particular a photoresist. The first mask layer is applied patterned with at least one first mask opening. The at least one first mask opening lies in the region in which the at least one recess is to be formed in the semiconductor body. The first mask layer may in particular comprise one or a plurality of first mask openings in the region(s) in which one or a plurality of recesses are to be formed in the semiconductor body. To produce the at least one first mask opening in the first mask layer, the first mask layer may, for example, be applied over a large area of the major surface of the semiconductor body and then be patterned using a suitable exposure process to produce the at least one first mask opening.

According to one further embodiment, a second mask layer is applied to the semiconductor body. The second mask layer is applied in particular between the first mask layer and the semiconductor body. In other words, the second mask layer is firstly applied to the semiconductor body and the first mask layer is then applied to the second. The second mask layer is applied in particular unpatterned and over a large area, i.e., in particular without an opening in the region of the at least one first mask opening of the first mask layer. To apply the second mask layer, a non-patterning, large-area method may thus be used, without the use of a mask. The first mask layer is thus applied to the second mask layer, which has been applied unpatterned over a large area. The second mask layer may in particular be a hard mask. The second mask layer may, for example, comprise or consist of an oxide or an oxynitride, preferably silicon dioxide ($SiO_2$) or silicon oxynitride (SiON).

According to one further embodiment, at least one second mask opening in the second mask layer and at least one recess in the semiconductor body are formed in the region of the at least one first mask opening in the first mask layer. In other words, wherever the first mask layer comprises a first mask opening a second mask opening is formed in the second mask layer and a recess is formed in the semiconductor body. The first mask layer is thus used inter alia to pattern the second mask layer, wherein this patterning does not take place in a separate procedure but rather in the course of production of the at least one recess in the semiconductor body.

The at least one recess to be produced projects from the major surface on which the first mask layer is applied into the semiconductor body preferably in a direction parallel to the growth direction thereof. The at least one recess in the semiconductor body may in particular form a blind hole-type recess, i.e., a recess which projects into the semiconductor body but does not extend right through it. The recess may thus comprise a side face and a bottom face, which are formed by surfaces of the semiconductor body. The side face in this case surrounds the bottom face and may be formed by different crystal faces of the semiconductor body. In particular, the at least one second mask opening and the at least one recess in the semiconductor body are formed in such a way, viewed from the first mask opening, that the recess forms an undercut with the second mask opening. In other words, in the region of the second mask opening the second mask layer forms an overhang which protrudes beyond the side face of the recess. When looking into the recess from the first mask layer, at least some of the side face of the recess thus appears shadowed by the second mask layer.

According to one further embodiment, the at least one second mask opening and the at least one recess are produced using a joint patterning method, in particular using a joint etching method. The joint etching method with which the at least one second mask opening and the at least one recess are formed may in particular be a wet chemical etching method. Alternatively, it may also be possible for a first etching method to be used to form the at least one second mask opening and for at least one second etching method to be used to form the at least one recess. The at least one second mask opening and the at least one recess may thus be formed using a two-stage etching method, i.e., with first and second etching methods carried out one after the other. The first etching method may be a dry chemical etching method. The dry chemical etching method for forming the at least one second mask opening may, for example, be an etching method in which a fluorine-containing gas, in particular a fluorine plasma, is used. The second etching method may be a wet chemical etching method. The first and second etching methods may in particular be adapted respectively to the material of the second mask layer and the material of the semiconductor body, in particular also with regard to the production of an undercut. In this respect, it may also be possible for some of the semiconductor material of the semiconductor body to be removed as early as with the first etching method and for the second etching method to be used to produce the final shape of the recess in the semiconductor body, in particular the undercut.

According to one further embodiment, a passivation layer is applied to the second mask layer and to the side face and the bottom face of the at least one recess. This means in particular that the passivation layer is applied to the second mask layer and to the side face and the bottom face of the at least one recess unpatterned and over a large area.

According to one further embodiment, the first mask layer is removed, for instance by a suitable lift-off method, prior to application of the passivation layer and after formation of the at least one second mask opening and the at least one recess in the semiconductor body. The passivation layer may thus be applied, for example, directly to the second mask layer. After application of the passivation layer, the latter preferably covers all the surfaces of the second mask layer and of the semiconductor body which lie exposed prior to application of the passivation layer in the region of the second mask opening and of the recess in the semiconductor body. In particular, the passivation layer also covers the region of the recess in the semiconductor body which is shadowed by the second mask layer when viewed in plan view onto the second mask layer and into the recess. The passivation layer thus preferably forms a contiguous layer, which extends from the surface of the second mask layer remote from the semiconductor body through the at least one second mask opening over the undercut and over the surfaces of the at least one recess. This may proceed by using a non-directional deposition method, for example, a chemical vapor deposition method such as for instance plasma-enhanced chemical vapor deposition (PECVD) or atomic layer deposition (ALD). When forming the passivation layer, a method is particularly advantageous which allows conformal coating of the surfaces to be coated, such that shadowed regions may also be coated with the passivation layer. The passivation layer may in particular comprise an electrically insulating material. The passivation layer may, for example, comprise an oxide or oxynitride, for instance silicon dioxide ($SiO_2$) or silicon oxynitride (SiON). It may in particular also be possible for the second mask layer and the passivation layer to comprise the same material.

According to one further embodiment, the passivation layer is removed from the bottom face of the at least one recess. This may mean in particular that at least some of the bottom face of the at least one recess is uncovered by removal of the passivation layer. Furthermore, the passivation layer may also be removed from the side of the second mask layer remote from the semiconductor body. In particular, the passivation layer is removed from the bottom face of the at least one recess in such a way that the passivation layer remains at least in part on the side face of the at least one recess. In other words, the bottom face of the at least one recess is thus uncovered, while the side face remains covered by at least some of the passivation layer. The passivation layer particularly preferably remains only on the side face of the at least one recess in the semiconductor body.

The passivation layer may be removed, for example, by means of a directional etch back method, such that the passivation layer may be purposefully removed from the bottom face of the at least one recess and optionally from the side of the second mask layer remote from the semiconductor body. The directional etch back method may, for example, be a dry chemical etching method, for example, using a fluorine-containing gas, for instance a fluorine plasma. Because the second mask layer with the at least one recess in the semiconductor body forms an undercut and thus the side face of the at least one recess is shadowed by the second mask layer, it is possible to ensure that only the bottom face and not the side face of the recess is accessible through the at least one second mask opening for the directional etch back method. To remove the passivation layer, a large-area directional etch back method may thus be used, without a separate mask being necessary. Instead, the second mask layer forms the mask necessary for removal of the passivation layer.

The method described here thus comprises a self-adjusting process sequence comprising combined definition of the at least one recess in the semiconductor body and production of the second mask opening in the second mask layer. This enables simplified process control and thus a reduction in cost and a reduced space requirement compared with known methods. In addition, no demands are made with respect to the inclination of the side face of the at least one recess in the semiconductor body, as long as it is ensured that the second mask layer forms a sufficiently large overhang over the side face of the at least one recess to shadow the latter sufficiently for the procedure of removing the passivation layer.

According to one further embodiment, the second mask layer remains on the semiconductor body after selective removal of the passivation layer. Together with the passivation layer on the side face of the at least one recess in the semiconductor body, a contiguous insulation layer may be formed on the semiconductor body. This insulation layer may be configured such that it substantially only does not cover the bottom face of the at least one recess.

According to one further embodiment, an etch stop layer is applied between the first and second mask layers. The etch stop layer may thus be applied as a cover layer to the second mask layer prior to formation of the first mask layer with the at least one first mask opening.

According to one further embodiment, in the course of the above-described formation of the at least one second mask opening in the second mask layer an opening in the etch stop layer is additionally formed in the region of the at least one first mask opening in the first mask layer. Depending on the material of the etch stop layer, the opening in the etch stop layer may be formed at the same time, i.e., with the same method, as formation of the at least one second mask opening in the second mask layer. Alternatively, a separate method, in particular an etching method, may be used to produce the at least one opening in the etch stop layer. The etch stop layer may, for example, comprise or consist of aluminum oxide ($Al_2O_3$). For selective opening of the etch stop layer, in this case phosphoric acid ($H_3PO_4$) is particularly suitable. After formation of the at least one second mask opening and the at least one recess in the semiconductor body, the etch stop layer thus preferably remains only on the side of the second mask layer remote from the semiconductor body.

As an alternative to application of an etch stop layer prior to formation of the at least one second mask opening in the second mask layer, the etch stop layer may also be applied over a large area after formation of the at least one second mask opening and of the at least one recess. The etch stop layer may in particular be applied after removal of the first mask layer. In other words, the etch stop layer may proceed prior to application of the passivation layer in the way described further above for the passivation layer. This may mean in particular that, in this case, after application the etch stop layer covers the side face and the bottom face of the at least one recess in the semiconductor body.

Irrespective of the time at which the etch stop layer is applied, the passivation layer may be applied to the etch stop layer, such that, after application of the passivation layer, the etch stop layer is completely covered thereby. This means, in other words, that in the case of large-area application of the etch stop layer, the passivation layer is then likewise applied thereto over a large area.

Removal of the passivation layer in particular at least from the bottom face of the at least one recess may also take place in the presence of an etch stop layer in the manner described further above. If the etch stop layer inter alia also covers the bottom face of the at least one recess, it may, after selective removal of the passivation layer in the region of the bottom face of the recess in the semiconductor body, be selectively removed in similar manner to the passivation layer by a directional etching method.

Through use of an etch stop layer, the second mask layer or the second mask layer and the bottom face of the recess in the semiconductor body may be protected during selective removal of the passivation layer in particular when using the previously described directional etch back method. If used as a material for the etch stop layer, aluminum oxide may, for example, act very selectively against fluorine-containing gases, such that, on removal of the passivation layer by means of such materials, the materials lying under the etch stop layer are protected. Through use of the etch stop layer, process control may continue with less stringent requirements in particular in respect of the duration of the method for removing the passivation layer. Over-etching may thus proceed for an extended period without the problem arising of the second mask layer being damaged or etched through. If the etch stop layer is deposited directly prior to the passivation layer, the etch stop layer remains, together with the passivation layer, at least in part on the side face of the at least one recess, after the etch stop layer and the passivation layer have been removed from the bottom face of the at least one recess and from the side of the second mask layer remote from the semiconductor body. The etch stop layer in this case contributes functionally to passivation of the side face of the at least one recess in the semiconductor body.

According to one further embodiment, in a method for producing a semiconductor chip with at least one through-connection a semiconductor body is produced with at least one recess provided with a passivation layer according to one or more of the previous embodiments. To complete the through-connection, the recess provided with the passivation layer on the side face may be filled with an electrically conductive material, in particular a metal or an alloy. Since the at least one recess in the semiconductor body is preferably free of the passivation layer solely in the region of the bottom face of the recess, the electrically conductive material with which the recess is filled is electrically connected with the corresponding semiconductor layer of the semiconductor body forming the bottom face only at the bottom face. This makes it possible electrically to contact this semiconductor layer from the opposite side of the semiconductor body. The semiconductor body may be mounted on a carrier by its side formed by the second mask layer, for example, using a bonding layer. The semiconductor layer contacted by the at least one through-connection may thus be contacted from the side of the semiconductor body facing the carrier.

BRIEF DESCRIPTION OF THE DRAWINGS

Further advantages, advantageous embodiments and further developments are revealed by the exemplary embodiments described below in connection with the figures, in which:

FIG. 1 shows a schematic representation of an example of a semiconductor chip with through-connections, FIGS. 3A and 3B show schematic representations of method steps of a method according to a further exemplary embodiment, FIGS. 4A to 4D show schematic representations of method steps of a method according to a further exemplary embodiment and FIGS. 5A to 5E show schematic representations of method steps of a method according to a further exemplary embodiment.

Figure 2A:
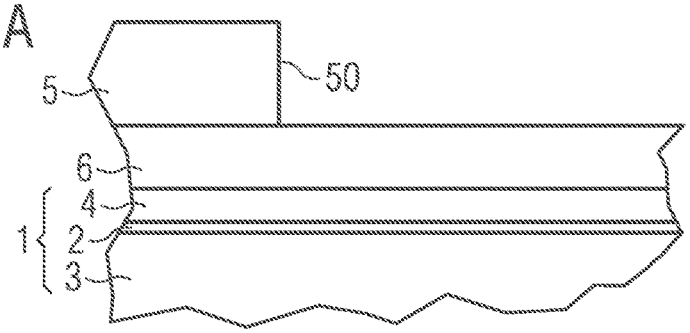
FIGS. 2A to 2D show schematic representations of method steps of a method according to one exemplary embodiment.

In the exemplary embodiments and figures, identical, similar or identically acting elements are provided in each case with the same reference numerals. The elements illustrated and their size ratios to one another should not be regarded as being to scale, but rather individual elements, such as, for example, layers, components, devices and regions, may have been made exaggeratedly large to illustrate them better and/or to aid comprehension.

DETAILED DESCRIPTION OF ILLUSTRATIVE EMBODIMENTS

To assist in understanding of the methods described in the following exemplary embodiments, FIG. 1 shows a semiconductor chip 100 which comprises through-connections, or vias, in a semiconductor body 101.

The semiconductor chip 100 comprises a semiconductor layer sequence which forms the semiconductor body 101 and which comprises an active region 102 provided for generating light, which active region is arranged between a first semiconductor layer 103 and a second semiconductor layer 104. In the example shown, the semiconductor body 101 has been applied to a carrier 105. The first semiconductor layer 103 is arranged on the side of the active region 102 remote from the carrier 105. Examples of suitable materials for the carrier 105 are semiconductor materials such as for instance germanium or silicon, which may be doped.

The first semiconductor layer 103 and the second semiconductor layer 104 have different conduction types, such that the active region 102 is arranged in a diode structure. For example, the first semiconductor layer 103 may be n-conductive and the second semiconductor layer 104 p-conductive or vice versa.

The side of the semiconductor body 101 remote from the carrier 105 forms a radiation exit face 106 of the semiconductor chip 100. When the semiconductor chip 100 is in operation, light is generated in the active region 102 which preferably predominantly exits from the semiconductor chip 100 through the radiation exit face 106.

The semiconductor body 101, in particular the active region 102, preferably contains a III-V semiconductor material. III-V semiconductor materials are particularly suitable for generating radiation in the ultraviolet ($In_xGa_yAl_{1-x-y}N$) through the visible ($In_xGa_yAl_{1-x-y}N$, in particular for blue to green radiation, or $In_xGa_yAl_{1-x-y}P$, in particular for yellow to red radiation) to the infrared ($In_xGa_yAl_{1-x-y}As$) region of the spectrum. Here in each case $0 \leq x \leq 1$, $0 \leq y \leq 1$ and $x+y \leq 1$ applies, in particular with $x \neq 1$, $y \neq 1$, $x \neq 0$ and/or $y \neq 0$. Using III-V semiconductor materials, in particular from the stated material systems, it is additionally possible to achieve high internal quantum efficiencies in the generation of radiation.

The semiconductor body 101 is bonded to a major surface of the carrier 105 facing the semiconductor body 101 by means of a bonding layer 107. The bonding layer 107 may, for example, be an adhesive layer, in particular an electrically conductive adhesive layer, or a solder layer.

A first connection layer 108 is additionally formed between the semiconductor body 101 and the carrier 105. The semiconductor body 101 comprises a plurality of recesses 109 which extend through the second semiconductor layer 104 and through the active region 102 into the first semiconductor layer 103. The first connection layer 108 extends through the recesses 109 and produces, from the side of the semiconductor body 101 facing the carrier 105, an electrically conductive connection with the first semiconductor layer 103, such that the first semiconductor layer 103 may be electrically contacted from the carrier side through the through-connections formed in this way. Furthermore, a second connection layer no is formed between the semiconductor body 101 and the carrier 105 which serves in electrical contacting of the second semiconductor layer 104.

The plurality of recesses 109 and thus the plurality of connections serve to inject charge carriers uniformly in the lateral direction via the first semiconductor layer 103 into the active region 102. The recesses 109 may, for example, be arranged in the manner of a matrix or in the form of a honeycomb pattern. In particular in the case of sufficient transverse conductivity of the first semiconductor layer 103, an embodiment of the semiconductor chip 100 is also conceivable which comprises just one single recess 109 and thus a single through-connection for electrical contacting of the first semiconductor layer 103.

The first connection layer 108 and/or the second connection layer no preferably in each case contain a metal, for example, titanium, platinum, nickel, gold, silver, aluminum or rhodium or a metal alloy comprising at least one of the stated materials, or consist of a metal or a metal alloy. Alternatively or in addition, the first connection layer 108 and/or the second connection layer no may contain a transparent conductive oxide or consist of such a material. Transparent conductive oxides (TCO) are transparent, conductive materials, generally metal oxides, such as, for example, zinc oxide, tin oxide, aluminum tin oxide, cadmium oxide, titanium oxide, indium oxide and indium tin oxide (ITO). In addition to binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. Furthermore, TCOs do not necessarily correspond to a stoichiometric composition and may also be p- or n-doped. The second connection layer 110 further preferably exhibits high reflectivity for the light generated in the active region 102. In the ultraviolet and blue spectral region, silver, aluminum or rhodium are, for example, suitable with regard to high reflectivity while gold is, for example, suitable in the red and infrared spectral region. By means of a reflective second connection layer 110, light generated in the active region 102 and emitted towards the carrier 105 may be deflected towards the radiation exit face 106 and exit through the latter from the semiconductor chip 100.

The semiconductor chip 100 comprises contacts 111, 112 which are provided for external electrical contacting of the semiconductor chip 100. When the semiconductor chip 100 is in operation, through the application of an electrical voltage between the contacts 111, 112 charge carriers can be injected from different sides into the active region 102 and there recombine with light emission.

The contacts 111, 112 may in particular contain a metal mentioned in connection with the first and second connection layers 108, 110 or a metal alloy having one of these materials or consist of such a material. Suitable materials are in particular those with which external electrical contacting, for instance by means of a bonding wire or by means of a soldered joint, may straightforwardly be produced. Gold is, for example, particularly suitable as a material for the contacts 111, 112.

To prevent an electrical short-circuit of the active region 102, an insulation layer 113 is formed between the side faces of the recesses 109 and the first connection layer 108. Furthermore, the insulation layer 113 extends between the connection layers 108 and no, such that an electrical short circuit therebetween may be simply prevented. The insulation layer 113 may, for example, contain an oxide, for instance silicon oxide or titanium oxide, a nitride, for instance silicon nitride, or an oxynitride, for instance silicon oxynitride or consist of such a material.

Electrical contacting of the connection layers 108, no by means of the contacts 111, 112 proceeds in the example shown merely by way of example by arranging the contacts 111, 112 on opposing sides of the carrier 105 and by injecting charge carriers through an electrically conductive, unpatterned carrier 105. Unlike in the example shown, the carrier 105 may also comprise at least one cutout, which extends vertically through the carrier 105 and which is filled with an electrically conductive material, for instance a metal. In this case, the carrier 105 may also be electrically insulating. The carrier 105 may in this case, for example, contain a ceramic material, for instance aluminum nitride, aluminum oxide or silicon nitride, or consist of such a material.

Furthermore, the side of the carrier 105 remote from the semiconductor body 101 may, unlike in the example shown, be free of an electrical contact. The electrical contacts 111, 112 may thus both be arranged on the side of the carrier 105 facing the semiconductor body 101. In this case, the carrier 105 is preferably electrically insulating. In contrast thereto, however, an electrically conductive carrier 105 may also be used.

Unlike in the example shown, in a further alternative the contacts 111, 112 may be arranged on the side of the carrier 105 remote from the semiconductor body 101, such that the semiconductor chip 100 is electrically contactable solely from one side of the carrier 105. For electrical contacting of the first connection layer 108 and for electrical contacting of the second connection layer no in each case at least one cutout may, for example, be provided in the preferably electrically insulating carrier 105, said cutouts in each case extending vertically through the carrier 105.

The semiconductor chip 100 shown in FIG. 1, which may take the form of a light-emitting diode chip or a laser diode chip, should be understood purely as an example and not as limiting with regard to subsequent exemplary embodiments. In particular, the semiconductor chip 100 may also comprise a light-absorbing active region instead of a light-emitting active region 102. Furthermore, the semiconductor chip 100 may also additionally or alternatively have a non-optoelectronic functionality, for example, in the form of a non-light-emitting diode or a transistor.

In conjunction with subsequent FIGS. 2A to 5E, exemplary embodiments are disclosed of methods for producing at least one recess 10 in a semiconductor body 1 and provided with a passivation layer 8. In the context of a method for producing a semiconductor chip, the at least one recess 10 provided with a passivation layer 8 may furthermore be filled with an electrically conductive material for forming an above-described connection layer, such that the electrically conductive material arranged in the recess forms a through-connection.

Purely by way of example and without limiting general applicability, the semiconductor bodies 1 revealed below may be configured like the semiconductor body 101 of the semiconductor chip 100 of FIG. 1 and may also, without further explicit reference, comprise features according to the example of FIG. 1. The methods described below are however also applicable to other semiconductor bodies which may, for example, comprise different layer sequences and/or materials from the semiconductor body 101 according to the above description.

FIGS. 2A to 2D show an exemplary embodiment of a method for producing a semiconductor body with at least one recess provided with a passivation layer. Each of FIGS. 2A to 2D and also of the subsequent figures shows a portion of the semiconductor body 1 and also of the layers applied thereto, the openings and the recess in the semiconductor body 1.

As shown in FIG. 2A, a semiconductor body 1 is provided, in the exemplary embodiment shown in the form of a semiconductor layer sequence with an active region 2 between a first semiconductor layer 3 and a second semiconductor layer 4. The semiconductor layer sequence may, for example, be deposited epitaxially, for instance by means of metal-organic vapor phase epitaxy (MOVPE) or molecular beam epitaxy (MBE), on a growth substrate. In contrast thereto, the semiconductor body 1 may also be provided on an auxiliary carrier other than the growth substrate.

In the context of the method steps described below, at least one recess 10 is formed from the side of the semiconductor body remote from the growth substrate or optionally from the auxiliary carrier, which recess 10 extends into the semiconductor body 1, as shown, for example, in FIG. 2B. This conveniently proceeds after the conclusion of deposition of the semiconductor layer sequence and thus after the conclusion of production of the semiconductor body 1, such that the semiconductor body 1 terminates, in a direction along the growth direction of the semiconductor layer sequence, with a major surface which may be perpendicular to the direction of growth. In the exemplary embodiment shown, the at least one recess 10 extends from this major surface through the second semiconductor layer 4 and the active region 2 into the first semiconductor layer 3.

As shown in FIG. 2A, to form the at least one recess 10 in the semiconductor body 1 a first mask layer 5 and a second mask layer 6 are applied to the semiconductor body 1, wherein the second mask layer is arranged between the first mask layer 5 and the semiconductor body 1. This means, in other words, that firstly the second mask layer 6 is applied to the semiconductor body 1 and then the first mask layer 5 is deposited on the second mask layer 6. The mask layers 5, 6 are applied in particular on the major surface terminating the semiconductor body 1 in the direction of growth.

The first mask layer 5 is applied patterned with at least one first mask opening 50 to the second mask layer 6. To this end, for example, a photoresist may be applied as the material for the first mask layer 5 which is patterned with the assistance of suitable exposure and development steps to form the first mask opening 50. As mentioned above, FIG. 2A and the subsequent figures show only a portion of the first mask opening 50, which defines the region in which the recess 10 is to be produced in the semiconductor body 1. The first mask layer 5 may in particular comprise one or more first mask openings 50, depending on how many recesses 10 are to be formed in the semiconductor body.

Prior to application of the first mask layer 5, the second mask layer 6 is applied unpatterned and over a large area to the semiconductor body 1. The second mask layer 6 may in particular be a hard mask, which, for example, comprises or consists of an oxide or oxynitride such as for instance silicon dioxide or silicon oxynitride. The second mask layer 6 may be formed using a suitable method acting over a large area, for example, a chemical or physical vapor deposition method.

Figure 2B:
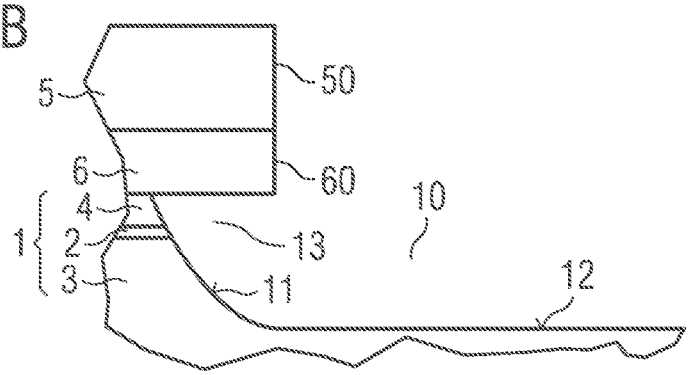

In a further method step, as shown in FIG. 2B, at least one second mask opening 60 is formed in the second mask layer 6 and at least one recess 10 is formed in the semiconductor body 1 in the region of the at least one first mask opening 50 in the first mask layer 5. To this end, an etching method may in particular be used, for example, a wet chemical etching method. Formation of the at least one second mask opening 60 and of the at least one recess 10 may proceed in particular by means of a joint etching method. The etching parameters are in this case adjusted in such a way that the recess 10, which comprises a side face 11 and a bottom face 12, forms an undercut 13 with the second mask opening 60, when viewed from the first mask opening 50. This means, in other words, that the second mask opening 60 has a smaller cross-section than the recess 10 in a region directly beneath the second mask opening 60. The second mask layer 6 thus projects over the recess 10 in the peripheral region of the recess 10, such that in plan view onto the first and/or second mask layer 5, 6 and into the recess 10 the side face 11 of the recess 10 is shadowed by the second mask layer 6.

The first and second mask openings 50, 60 and accordingly the recess 10 may have a round or a polygonal cross-sectional shape. The first and second mask openings 50, 60 may each have dimensions in the range of a few tens of micrometers, for example, around 30 μm to around 50 μm. The depth of the underetch in the semiconductor body 1 directly beneath the second mask layer 6, i.e., the size of the undercut 13, is greater than or equal to the thickness of the subsequently applied passivation layer 8 and may amount, for example, to up to 300 nm, while the depth of the recess 10 into the semiconductor body 1 may amount, for example, to around 600 nm to 700 nm, depending on how thick the region of the semiconductor layer sequence is which is to be bridged by the through-connection. Contact metallization, like the connection layer no described above in relation to FIG. 1, may be arranged between the second mask layer 6 and the semiconductor body 1 with spacing, for example, spacing of one or more micrometers, typically around 5 μm. The dimensions described should be understood as being given purely by way of example and may also deviate from the stated values depending on the configuration of the semiconductor body 1 and depending on the requirements placed on the semiconductor chip to be produced.

Figure 2C:
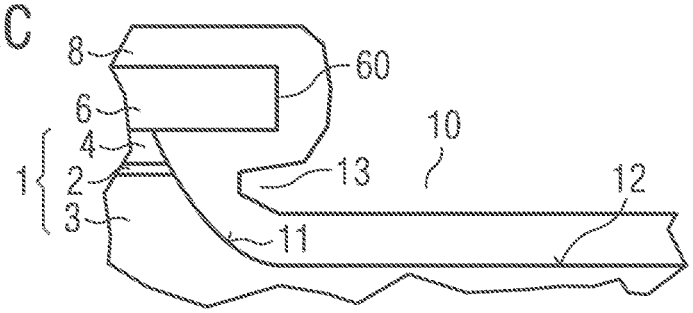

In a further method step, as shown in FIG. 2C, a passivation layer 8 is applied over a large area and unpatterned. To this end, prior to application of the passivation layer 8 the first mask layer 5 may in particular be removed. The passivation layer 8 is applied using a method which is suitable for covering all bare surfaces of the second mask layer 6 and all bare surfaces of the recess 10 as uniformly as possible and at least with a continuous layer. A plasma-enhanced chemical vapor deposition method or an atomic layer deposition method may be used, for example. After application of the passivation layer 8, the latter completely covers the side face 11 of the recess 10 even in the region of the underetch forming the undercut 13 directly beneath the second mask layer 6, i.e., at the edge of the recess 10. The passivation layer 8 comprises an electrically insulating material, for example, an oxide or oxynitride such as for instance silicon dioxide or silicon oxynitride. In particular, the passivation layer 8 may also comprise the same material as the second mask layer.

Figure 2D:
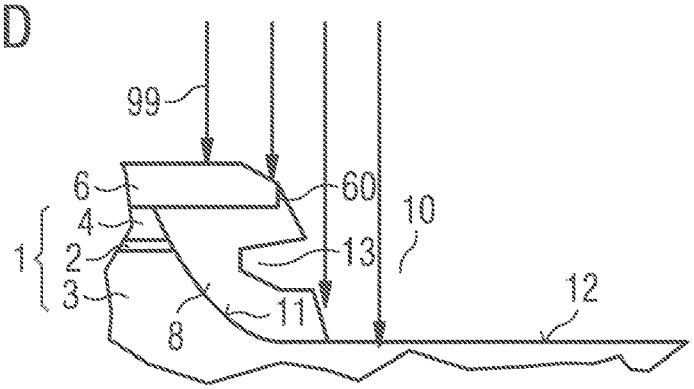

FIG. 2D shows a further method step, in which the passivation layer 8 is removed selectively from the side of the second mask layer 6 remote from the semiconductor body 1 and from the bottom face 12 of the at least one recess 10, such that the passivation layer 8 remains at least in part on the side face 11 of the at least one recess 10 in the region of the underetch or undercut 13, particularly preferably on the entire side face 11. A directional etch back method 99 is used in particular for this purpose, as indicated by the arrows shown in FIG. 2D. The etch back method 99 may proceed over a large area and without the use of an additional mask, since the second mask layer 6 ensures the necessary shadowing of the side face 11 of the at least one recess 10 in the semiconductor body 1. The directional etching method 90 may, for example, be a dry chemical etching method, in which a fluorine-containing gas, in particular a fluorine plasma is used. Particularly preferably, after the etch back method 99 the passivation layer 8 remains solely at least in part on the side face 11 of the at least one recess 10 in the semiconductor body 1.

Because production of the second mask opening 60 in the second mask layer 6, which defines that region of the recess 10 in which the passivation layer 8 is removed again, and production of the recess 10 itself are combined in a joint method step, formation of the second mask opening 60 relative to the recess 10 takes place in a self-adjusting process. The defined underetching of the second mask layer 6 represents markedly simpler process control compared with a separately produced mask and thus a cost reduction compared with known methods.

The second mask opening 60 and the recess 10 may also be produced using a multistage etching method, as shown in FIGS. 3A and 3B. To this end, for example, the at least one second mask opening 60 may be formed in the second mask layer 6 by means of a first etching method. If an oxide or oxynitride is used as the material for the second mask layer 6, the method may, for example, be a dry chemical etching method. As is visible in FIG. 3A, a region of the semiconductor body 1 may also be removed by such an etching method. The optionally final configuration of the at least one recess 10 in the semiconductor body 1 may proceed by means of a second etching method. In particular, the second etching method, which may, for example, be a wet chemical etching method, may produce the undercut 13 through underetching of the second mask layer 6 in the region of the edge of the second mask opening 60.

Such a multistage etching method may be advantageous, for example, in conjunction with a semiconductor body 1 based on an InAlGaN compound semiconductor material, since with this material system it may be possible for purely wet chemical etching of Ga-polar surfaces to be possible only with difficulty. Starting from a dry-etched opening 60 in the second mask layer 6 and optionally also a region in the semiconductor body 1, the undercut 13 necessary for the further method may however be produced using additional wet chemical etching.

In the case of nitride compound semiconductor material systems, i.e., a semiconductor body based on InAlGaN, the etching action of a wet chemical etching method may be dependent on the crystal face to be etched. In this case, it may be advantageous for the mask openings 50, 60 and accordingly the recess 10 to have a hexagonal shape.

The method step shown in FIG. 3B may be followed by the further method steps described in relation to FIGS. 2C and 2D.

A further exemplary embodiment of a method for producing a semiconductor body 1 with at least one recess 10 provided with a passivation layer 8 is described in relation to FIGS. 4A to 4D. Compared with the methods described in conjunction with the previous exemplary embodiments, in the method of FIGS. 4A to 4D an etch stop layer 9 is applied in the form of a cover layer to the second mask layer 6 prior to application of the first mask layer 5. The etch stop layer 9, as shown in FIG. 4A, may in particular be applied to the second mask layer 6 over a large area and unpatterned. The first mask layer 5 with the at least one first mask opening 50 is formed thereover, as described above.

In the course of producing the second mask opening 60 in the second mask layer 6 and the at least one recess 10 in the semiconductor body 1, these forming the undercut 13, an opening 90 is also formed in the etch stop layer 9 in the region of the at least one first mask opening 50. Accordingly, after formation of the at least one recess 10 in the semiconductor body 1 the etch stop layer 9 remains only on the side of the second mask layer 6 remote from the semiconductor body 1. The etch stop layer 9 may, for example, comprise or consist of aluminum oxide, which is highly selective in particular in relation to fluorine-containing gases which may be used for dry chemical etching methods, for example, for the second mask layer 6 or the passivation layer 8. In the event of aluminum oxide being used, phosphoric acid may, for example, be suitable for selectively opening the etch stop layer 9 in the region of the first mask opening 50 in the first mask layer 5.

In the further method steps shown in FIGS. 4C and 4D, as was already the case in the above-described methods of FIGS. 2A to 2D, after removal of the first mask layer 5 the passivation layer 8 is applied over a large area and selectively removed by a directional etch back method 99 from the side of the second mask layer 6 remote from the semiconductor body 1 and the bottom face 12 of the recess 10, such that the passivation layer 8 remains on the side face 11 of the recess 10 in the region of the undercut 13. In particular, the passivation layer 8 is applied to the etch stop layer 9, such that the latter is covered by the passivation layer 8. The etch stop layer 9 on the side of the second mask layer 6 remote from the semiconductor body 1 may protect said second mask layer 6 during the directional etch back method 99, such that process control can be relaxed. For instance, over-etching may in particular proceed for an extended period compared with a method without etch stop layer, without the problem arising of the second mask layer 6 being damaged or etched through.

A further method for producing a semiconductor body 1 with at least one recess 10 provided with a passivation layer 8 according to a further exemplary embodiment is described in relation to FIGS. 5A to 5E. In this method, an etch stop layer 9 is likewise additionally used, as was already the case in the preceding exemplary embodiment.

The method steps shown in FIGS. 5A and 5B here correspond to the method steps described in relation to FIGS. 2A and 2B and optionally to the method steps described in relation to FIGS. 3A and 3B. As shown in FIG. 5C, in a further method step an etch stop layer 9 is applied over a large area to all the bare surfaces of the second mask layer 6 and of the at least one recess 10 in the semiconductor body 1. A method described previously in conjunction with the passivation layer 8 may, for example, be used for this purpose. The passivation layer 8 is applied over a large area of the etch stop layer 9, as described in conjunction with the previous methods, such that the etch stop layer 9 is completely covered by the passivation layer 8.

In a further method step, as shown in FIG. 5D, the previously described directional etch back method 99 is used selectively to remove the passivation layer 8 from the side of the second mask layer 6 remote from the semiconductor body 1 and from the bottom face 12 of the recess 10, such that as a result of the undercut 13 the passivation layer 8 remains on the side face 11 of the recess 10.

In a further method step, as shown in FIG. 5E, the etch stop layer 9 may be removed from the side of the second mask layer 6 remote from the semiconductor body 1 and from the bottom face 12 of the recess 10. Because the etch stop layer 9 is arranged under the passivation layer 8, it remains on the side face 11 of the at least one recess 10 together with the passivation layer 8 and thus contributes to passivation of the side face 11 of the at least one recess 10.

The passivation layer 8 produced using the above-described methods on the side face 11 of the at least one recess 10 in the semiconductor body 1, and optionally also the etch stop layer 9, form together with the second mask layer 6 remaining on the semiconductor body 1 an insulation layer such as, for example, the insulation layer 113 described in relation to FIG. 1, which insulation layer 113 covers the semiconductor body 1 contiguously apart from the bottom face 12 of the at least one recess 10.

The exemplary embodiments described in connection with the figures may alternatively or in addition comprise further features described above in the general part.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:
1. A method comprising:
A) providing a semiconductor body;
B) applying a first mask layer and a second mask layer to the semiconductor body, wherein the second mask layer is applied unpatterned to the semiconductor body and the first mask layer is applied patterned with at least one first mask opening to the second mask layer;
C) forming at least one second mask opening in the second mask layer and at least one recess in the semiconductor body in a region of the at least one first mask opening in the first mask layer, wherein the recess comprises a side face and a bottom face and the recess forms an undercut with the second mask opening, when viewed from the first mask opening;
D) applying a passivation layer unpatterned to the second mask layer and to the side face and the bottom face of the at least one recess; and
E) removing the passivation layer from the side of the second mask layer remote from the semiconductor body and the bottom face of the at least one recess, wherein the passivation layer remains at least in part on the side face of the at least one recess; and
wherein the method further comprises performing at least one of:
applying, in method step B, an etch stop layer between the first and second mask layers; or applying, over a large area, between method steps C and D, an etch stop layer to the second mask layer, to the side face and the bottom face of the at least one recess.

2. The method according to claim 1, wherein the second mask layer remains on the semiconductor body and forms a contiguous insulation layer together with the passivation layer after method step E.

3. The method according to claim 1, further comprising, prior to method step D, removing the first mask layer.

4. The method according to claim 1, wherein, in method step C, the at least one second mask opening and the at least one recess are formed by a joint etching method, and wherein the joint etching method is a wet chemical etching method.

5. The method according to claim 1, wherein, in method step C, the at least one second mask opening is formed by a first etching method and the at least one recess is formed by an at least one second etching method, and wherein the first etching method is a dry chemical etching method and the second etching method is a wet chemical etching method.

6. The method according to claim 1, wherein the semiconductor body comprises a semiconductor layer sequence with semiconductor layers arranged one above the other, and wherein the first mask layer is applied to a major surface of the semiconductor layer sequence.

7. The method according to claim 1, wherein, in method step E, the passivation layer is removed by a directional etch back method.

8. The method according to claim 7, wherein the directional etch back method is a dry chemical etching method.

9. The method according to claim 1, wherein the second mask layer and the passivation layer comprise the same material.

10. The method according to claim 1, wherein, in method step C, at least one opening is formed in the etch stop layer in the region of the at least one first mask opening such that, after method step C, the etch stop layer remains only on the side of the second mask layer remote from the semiconductor body.

11. The method according to claim 1, wherein, in method step E, the etch stop layer and the passivation layer are removed from the side of the second mask layer remote from the semiconductor body and from the bottom face of the at least one recess, and wherein the etch stop layer and the passivation layer remain at least in part on the side face of the at least one recess.

12. The method according to claim 1, wherein the etch stop layer comprises aluminum oxide.

13. The method according to claim 1, further comprising using a phosphoric acid to remove the etch stop layer.

14. The method according to claim 1, wherein the second mask layer and/or the passivation layer comprise silicon dioxide or silicon oxynitride.

15. The method according to claim 1, wherein the first mask layer is a resist mask.

16. The method according to claim 1, wherein a fluorine-containing gas is used to remove the passivation layer.

17. A method comprising:
A) providing a semiconductor body;
B) applying a first mask layer and a second mask layer to the semiconductor body, wherein the second mask layer is applied unpatterned to the semiconductor body and the first mask layer is applied patterned with at least one first mask opening to the second mask layer;
C) forming at least one second mask opening in the second mask layer and at least one recess in the semiconductor body in a region of the at least one first mask opening in the first mask layer, wherein the recess comprises a side face and a bottom face and the recess forms an undercut with the second mask opening, when viewed from the first mask opening;
D) applying a passivation layer unpatterned to the second mask layer and to the side face and the bottom face of the at least one recess; and
E) removing the passivation layer from the side of the second mask layer remote from the semiconductor body and from the bottom face of the at least one recess, wherein the passivation layer remains at least in part on the side face of the at least one recess,
wherein, in method step B, an etch stop layer is applied between the first and second mask layers, and in method step C, at least one opening is formed in the etch stop layer in the region of the at least one first mask opening such that after method step C the etch stop layer remains only on the side of the second mask layer remote from the semiconductor body, and the etch stop layer comprises aluminum oxide and/or phosphoric acid is used to remove the etch stop layer, or
wherein, between method steps C and D, an etch stop layer is applied over a large area to the second mask layer and to the side face and the bottom face of the at least one recess, and in method step E, the etch stop layer and the passivation layer are removed from the side of the second mask layer remote from the semiconductor body and from the bottom face of the at least one recess and the etch stop layer and the passivation layer remain at least in part on the side face of the at least one recess.

18. A method comprising:
A) providing a semiconductor body;
B) applying a first mask layer and a second mask layer to the semiconductor body, wherein the second mask layer is applied unpatterned to the semiconductor body and the first mask layer is applied patterned with at least one first mask opening to the second mask layer,
C) forming at least one second mask opening in the second mask layer and at least one recess in the semiconductor body in a region of the at least one first mask opening in the first mask layer, wherein the recess comprises a side face and a bottom face and the recess forms an undercut with the second mask opening, when viewed from the first mask opening;
D) applying a passivation layer unpatterned to the second mask layer and to the side face and the bottom face of the at least one recess;
E) removing the passivation layer from the side of the second mask layer remote from the semiconductor body and from the bottom face of the at least one recess,
wherein the passivation layer remains at least in part on the side face of the at least one recess,
wherein, in method step C, the at least one second mask opening and the at least one recess are formed by a joint etching method, or
wherein, in method step C, the at least one second mask opening is formed by a first etching method and the at least one recess is formed by at least one second etching method, and wherein, the first etching method is a dry chemical etching method and the second etching method is a wet chemical etching method.

19. The method according to claim 18, wherein the second mask layer comprises an oxide or an oxynitride.

20. The method according to claim 18, wherein the second mask layer comprises silicon dioxide or silicon oxynitride.

* * * * *